(12) United States Patent
Hshieh (10) Patent No.: US 6,262,453 B1
(45) Date of Patent: *Jul. 17, 2001

(54) DOUBLE GATE-OXIDE FOR REDUCING GATE-DRAIN CAPACITANCE IN TRENCHED DMOS WITH HIGH-DOPANT CONCENTRATION BURIED-REGION UNDER TRENCHED GATE

(75) Inventor: Fwu-Iuan Hshieh, Saratoga, CA (US)

(73) Assignee: MagePOWER Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/066,033

(22) Filed: Apr. 24, 1998

(51) Int. Cl.[7] .................................................. H01L 29/76
(52) U.S. Cl. .......................... 257/341; 257/304; 257/330; 257/331; 257/333; 257/334; 257/335; 257/374; 257/395; 257/396; 257/397
(58) Field of Search ..................................... 257/341, 330, 257/331, 335, 328, 333, 334, 329, 374, 395, 396, 397, 304

(56) References Cited

U.S. PATENT DOCUMENTS

| 4,893,160 | * | 1/1990 | Blanchard | 257/341 |
| 4,954,854 | * | 9/1990 | Dhong et al. | 357/23.4 |
| 5,442,214 | * | 8/1995 | Yang | 257/328 |
| 5,637,898 | * | 6/1997 | Baliga | 257/330 |
| 5,770,504 | * | 6/1998 | Brown et al. | 438/296 |

* cited by examiner

Primary Examiner—Eddie C. Lee
Assistant Examiner—Matthew E. Warren
(74) Attorney, Agent, or Firm—Bo-In Lin (57) ABSTRACT

This invention discloses a DMOS power device supported on a substrate. The DOS power device includes a drain of a first conductivity type disposed at a bottom surface of the substrate. The DMOS power device further includes a gate disposed in a trench opened from a top surface of the substrate, the gate having a polysilicon layer filling the trenches padded by a double gate-oxide structure. The double gate-oxide structure includes a thick-oxide-layer covering walls of the trench below an upper portion of the trench and a thin-gate-oxide covering walls of the upper portion of the trench thus defining a champagne-glass shaped gate in the trench. The DMOS power device further includes a source region of the first conductivity type disposed in the substrate surrounding a top portion of the trench. The DMOS power device further includes a body region of a second conductivity type disposed in the substrate surrounding the trench and encompassing the source region.

14 Claims, 9 Drawing Sheets

DOUBLE GATE-OXIDE FOR REDUCING GATE-DRAIN CAPACITANCE IN TRENCHED DMOS WITH HIGH-DOPANT CONCENTRATION BURIED-REGION UNDER TRENCHED GATE

BACKGROUND OF THE INVENTION

1. Field of the Invention

This invention relates generally to the structure and fabrication process of a trenched DMOS power device. More particularly, this invention relates to a novel trenched DMOS device structure and fabrication process with double gate-oxide structure to reduce the gate/drain capacitance. The switching speed of the trenched DMOS device is improved without degrading the breakdown voltage. Also, a low threshold voltage is maintained by controlling the thickness of a thin-gate-oxide layer. Furthermore, the drain-to-source resistance is decreased by forming a high-dopant-concentration N+ buried-region without significantly increasing the drain-to-gate capacitance.

2. Description of the Prior Art

Several difficulties are faced by those involved in the technology to further increase the cell density of a power DMOS transistor in order to achieve a lower on resistance and meanwhile attempting to increase the DMOS switching speed.

Figure 1:
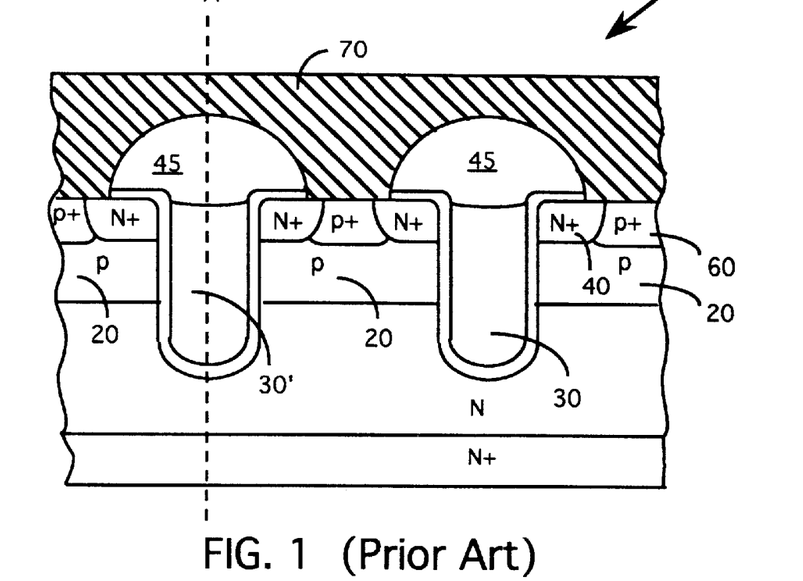
FIG. 1 is a cross-sectional view of a trench DMOS cell of a prior art with single gate oxide.

FIG. 1 shows a DMOS prior art DMOS trench device 10 supported on a N+ substrate and an N-epitaxial layer. The DMOS device 10 includes trenched-gates 30 formed in the trenches filled with polysilicon and surrounded by body regions 20 and covered by an insulation layer 45. Each transistor cell further includes a N+ source region encompassed in the body region 20 disposed near the top surface of the substrate and right next to the trenched gates 30. The body region 20 further includes a high concentration P+ body dopant region 60 for reducing the contact resistance with the source contact metal 70. The source contact metal 70 contact the source regions 40 through openings in the insulation layer 45. The body regions 20 are formed with a depth less than the depth of the trenched-gate 30. The gate oxide uniformly grows along the trench sidewall. However, the device now faces the difficulty of increasing gate/drain capacitance as cell density increases. Moreover, early breakdown near the bottom of the trenched gates becomes a design concern if the gate oxide is not thick enough. Due to this limitation, a higher cell density of the DMOS power device with low gate/drain capacitance cannot be easily achieved. A conventional method is to increase the thickness of the gate oxide layer near. However, a gate-oxide layer with greater thickness will often affect the threshold voltage.

Therefore, a need still exits in the art of power device fabrication, particularly for trenched DMOS design and fabrication, to provide a structure and fabrication process that would resolve these difficulties. More specifically, it is preferably that a transistor with a high cell density can be produced with effective prevention against early breakdown without increasing the device threshold voltage. It is further desirable to reduce the gate charges between gate/drain such that the device switching speed can be improved.

SUMMARY OF THE PRESENT INVENTION

It is therefore an object of the present invention to provide a new DMOS fabrication process and a new device structure. Those of ordinary skill in the art of trenched DMOS fabrication will be enabled to reduce gate-to-drain capacitance to achieve higher device switching speed. Meanwhile, the technical difficulty of breakdown voltage degradation is resolved without causing higher threshold voltage due to a thicker gate-oxide. The performance characteristics of the trenched DMOS device are improved such that aforementioned limitations and difficulties as encountered in the prior art can be overcome.

Specifically, it is an object of the present invention to provide an novel trenched DMOS structure and fabrication process with a double-gate-oxide structure under the gate to form champagne-glass shaped gates. The double gate-oxide structure includes a thick-gate-oxide covering the trench walls at the lower portion of the gates. The thick-oxide has a thickness about two-to-four time's thickness of the thin-gate-oxide layer covering the trench-walls on the upper portion of the trenched gates to prevent threshold voltage from increasing due to process variation causing p body diffusion into the thick oxide area. An early breakdown is prevented while the gate/drain capacitance is reduced with improved switching speed.

Another object of the present invention is to provide a novel trenched DMOS structure and fabrication process wherein the DMOS transistor is provided a double-gate-oxide structure under the gate to form champagne-glass shaped gates. The trenched DMOS device is further provided with a shallow lightly doped body region to reduce the threshold voltage. Therefore, thick-gate-oxide layer covering the trench walls near the bottom portion is implemented to prevent early breakdown and to increase the switch speed without adversely increasing the threshold voltage.

Another object of the present invention is to provide an improved trench DMOS structure and fabrication process wherein the DMOS transistor is provided with a double-gate-oxide structure under the gate to form champagne-glass shaped gates. The shallow lightly doped body region is further formed with less depth than the source regions. Therefore, shallow lightly doped body region is implemented to reduce the threshold voltage threshold voltage without causing a punch through problem by limiting the depth of the shallow lightly doped body region.

Another object of the present invention is to provide an improved trench DMOS structure and fabrication process wherein the DMOS transistor is provided with a double-gate-oxide structure under the gate to form champagne-glass shaped gates. A high dopant-concentration buried region is formed a distance below the trenched gate between the bottom of the trenched gate and the N+ substrate. The gate-to-drain capacitance is kept substantially unchanged while the source-to-drain resistance is decreased.

Briefly, in a preferred embodiment, the present invention discloses a DMOS transistor cell formed in a semiconductor substrate with a heavily doped first conductivity type as a drain region. The transistor cell includes a epitaxial layer doped with impurities of a first conductivity type, lying on the semiconductor substrate. The transistor cell further includes a gate disposed in a trench padded with a double-gate-oxide structure having a thick-gate-oxide covering trench walls on a lower portion of the trench and a thin-gate-oxide cover trench walls on an upper portion of the trench. The trench is opened vertically downward from the top surface disposed substantially in a center portion of the transistor cell with bottom surface lies above the heavily doped substrate. The gate is defined by a polysilicon layer disposed the trench insulated from the substrate by the double-gate-oxide structure thus defining a champagne glass shaped gate. The transistor cell further includes a source region disposed in the substrate surrounding an upper portion of the trench. The transistor cell further includes a body region doped with impurities of a second conductivity type in the substrate surrounding the source region and the trench gate therein. The body region extends vertically downward to a thin gate oxide/thick gate oxide boundary of the transistor cell wherein the body region providing a channel for transmitting a current therein from the source region to the drain along a substantially vertical direction. The transistor cell further includes a high-dopant-concentration substrate-type buried region disposed at a distance below the trenched gate for decreasing the source-to-drain resistance Rds without significantly increasing the gate-to-drain capacitance.

In a preferred embodiment, the transistor cell further includes a shallow lightly doped body region in an upper portion of the body region. The shallow lightly doped body region has a depth slightly greater than the source region. The shallow lightly doped body region is doped with a lower concentration of impurities of the second conductivity type than the body region to reduce a threshold voltage. Therefore, an early breakdown is prevented by forming the thick-gate-oxide layer of greater thickness near the bottom of the trenches, without unduly increasing the threshold voltage.

The present invention further discloses a method for fabricating a DMOS transistor on a substrate that has high cell density. The method includes the steps of: (a) forming an epitaxial layer of a first conductivity type on a heavily doped first conductivity type substrate functioning as a drain; (b) applying a trench mask for etching a plurality of trenches with a bottom surface lies above the heavily doped substrate; (c) implanting a high-concentration buried substrate-type region a distance below each of the trenches then removing the trench mask; (d) growing a thick-gate-oxide layer followed by depositing a photoresist; (e) exposing an the photoresist for selectively removing the photoresist from a top portion of the trench followed by wet etching to selectively removing the thick-gate-oxide layer not covered by the photoresist layer; (f) removing the photoresist and growing a thin-gate-oxide covering an upper portion of trench-walls thus forming a double-gate-oxide structure covering the walls of the trench; (g) depositing a polysilicon layer in the trench followed by removing the polysilicon from above the top surface of the trenches thus forming a champagne-glass shaped gate in the trench; (h) performing a blank body implant with impurities of a second conductivity type followed by a body-diffusion process at an elevated temperature for forming a body layer; and (i) applying a source mask for performing a first-conductivity-type-dopant implant to form a plurality of source regions of said first conductivity type; and (j) performing a high energy light-dose first-conductivity-type-dopant implant to form a shallow lightly-doped body region at an upper portion of the body regions for reducing the device threshold voltage. In a preferred embodiment, the method for fabricating the DMOS transistor further includes a step (k) of forming a body contact resistance reduction region by performing a low-energy body-dopant implant to form a heavy body-doped region between the source regions.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 2A:
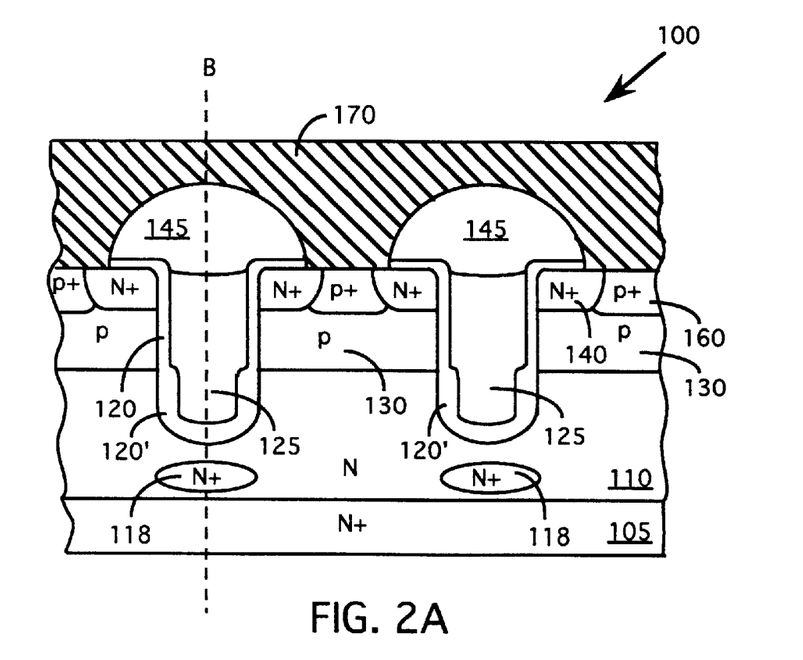
FIG. 2A is a cross-sectional view of a n-channel trench DMOS cell includes a champagne-glass shaped trenched gate padded by a double-gate-oxide structure having a buried high-dopant-concentration region underneath according to a DMOS configuration of this invention.

Referring to FIG. 2A for a cross sectional view of a DMOS device 100 of the present invention. The DMOS transistor 100 is formed on a N+ substrate 105 supporting an N epitaxial layer 110 thereon. The DMOS transistor 100 includes a plurality of cell in the core cell area. Each of these transistor cells includes a trenched gate 125 disposed substantially in the center of the transistor cell with the trench bottom surface lying above the N$^+$ substrate. A N$^+$ source region 140 and a P-body region 130 surround the trenched gate 125. The P-body region 130 is formed to have a less depth than that of the trenched gates 120. The source regions 140 are shallower and the P-body region 130 encompasses the shallower source region 140. The P-body region 130 extends between two neighboring trenched gates wherein a mid-portion of the body region defining a boundary of the transistor cell. Each of the trenched gates 125 of this invention is a champagne-glass shaped trenched gate padded by a double-gate-oxide structure from the source and body regions. The double-gate-oxide structure includes a thick-gate-oxide layer 120' covering the trench walls on the bottom portion of the trench. The double-gate-oxide structure further includes a thin-gate-oxide layer 120 covering the trench walls on the upper portion of the trench which has a layer thickness about one-fourth to one half the thickness of the thick-gate-oxide layer. The thick-gate-oxide layer 120' has a thickness ranging from 450 to 4,000 Angstroms. The breakdown voltage over this thick-gate-oxide layer i.e., BVox, is greater than the drain-to-source breakdown voltage, i.e., BVds $$Bvox > BVds \qquad (1)$$

Therefore, with a double-gate-oxide structure, an early breakdown that usually occurs at the bottom of the trenched gate 125 is prevented because it is now padded with thick-gate-oxide layer 120'. Also, an increase in threshold due to a thicker gate-oxide 120' is also prevented because the upper portion of the trenched gate is padded with a thin-gate-oxide layer 120.

The DMOS transistor 100 further has a high-dopant-concentration N+ buried region 118 formed below the bottom of the champagne-glass shaped trenched gate 125.

Figure 2B:
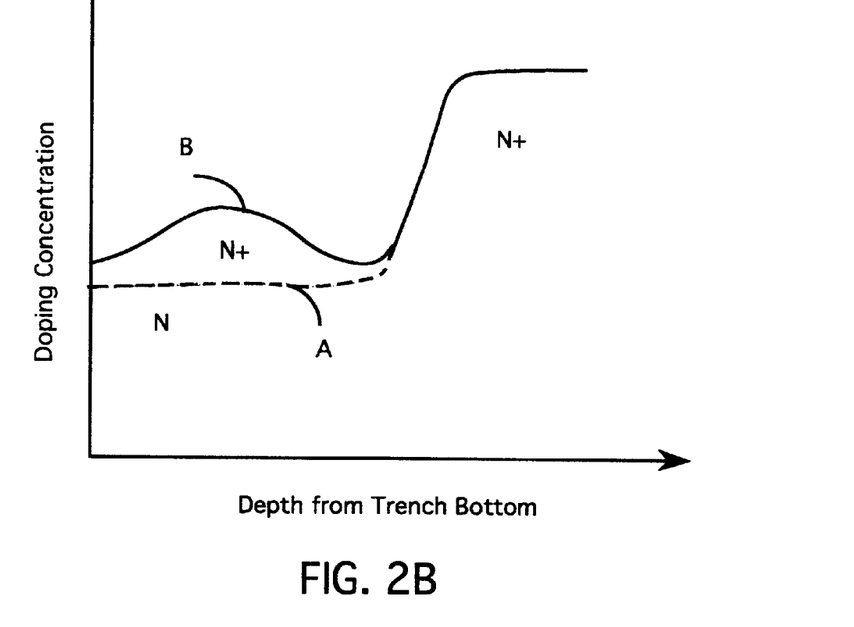
FIG. 2B shows the variation of a net dopant concentration along a vertical line starting from bottom of the trench toward the bottom of the substrate.

The N+ buried-region 118 is formed between the bottom of the trenched gate 125 and the bottom N+ layer of the substrate. The N+ buried region 118 formed in the N-epitaxial layer 110 provides a benefit of reducing the drain-to-source resistance $R_{ds}$. There is no significant increase of the drain-to-gate capacitance by introducing the N+ buried-region 118 because the dopant concentration near the bottom of the trenched gate 125 is not significantly increased. A comparison of the net dopant concentration between a conventional trenched DMOS and the DMOS of this invention is shown in FIG. 2B. Curve A is the variation of dopant concentration along a vertical line starting from the bottom of the trench and curve B shows the variation of the dopant concentration when there is a N+ buried region 118. There is a peak dopant concentration near the N+ buried region 118 thus the gate-to-drain resistance is reduced. However, the dopant concentration near the bottom of the trench, as that shown in FIG. 2B, is only slightly higher than the conventional DMOS. The gate-drain capacitance is maintained about the same without significant increase while a lower gate-to-drain resistance is achieved.

Figure 3A:
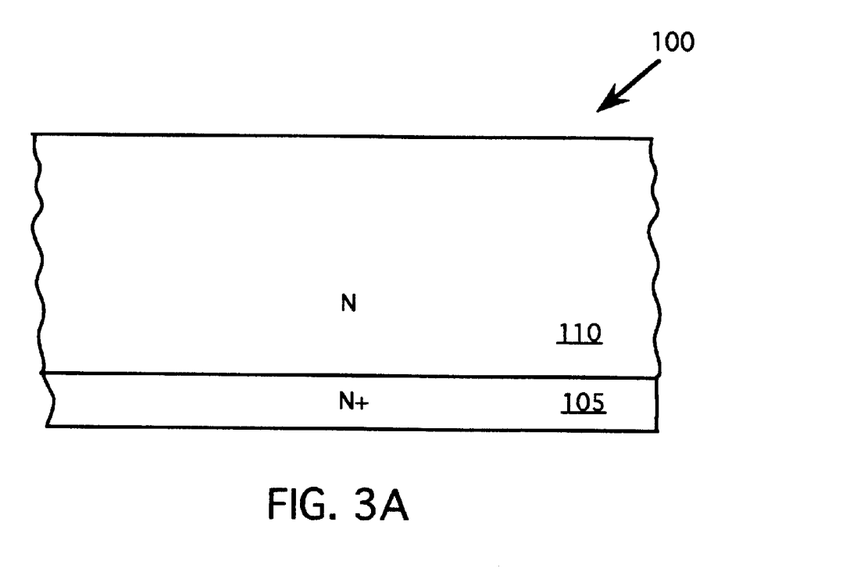
FIGS. 3A to 3M are a series of cross sectional views for showing the manufacture process of a novel trench DMOS transistor includes a champagne-glass shaped trenched gate padded by a double-gate-oxide structure with a high-dopant-concentration buried-region under the gate according to a DMOS configuration of this invention.

Please refer to FIGS. 3A to 3M for the processing steps carried out to manufacture a power DMOS device 100 of this invention. As shown in FIG. 3A, the processing steps begins by first growing a N epitaxial layer 110 with a resistivity ranging from 0.1 to 1.0 ohm-cm on top of a N+ substrate 105. The substrate has a resistivity of 0.001 to 0.007 ohm-cm. The thickness and the resistivity of the epitaxial layer 110 depend on the device requirements for the on-resistance and breakdown voltage. In a preferred embodiment, the thickness of the epi-layer 110 is about three to twenty microns (3–20 $\mu$m).

Figure 3B:
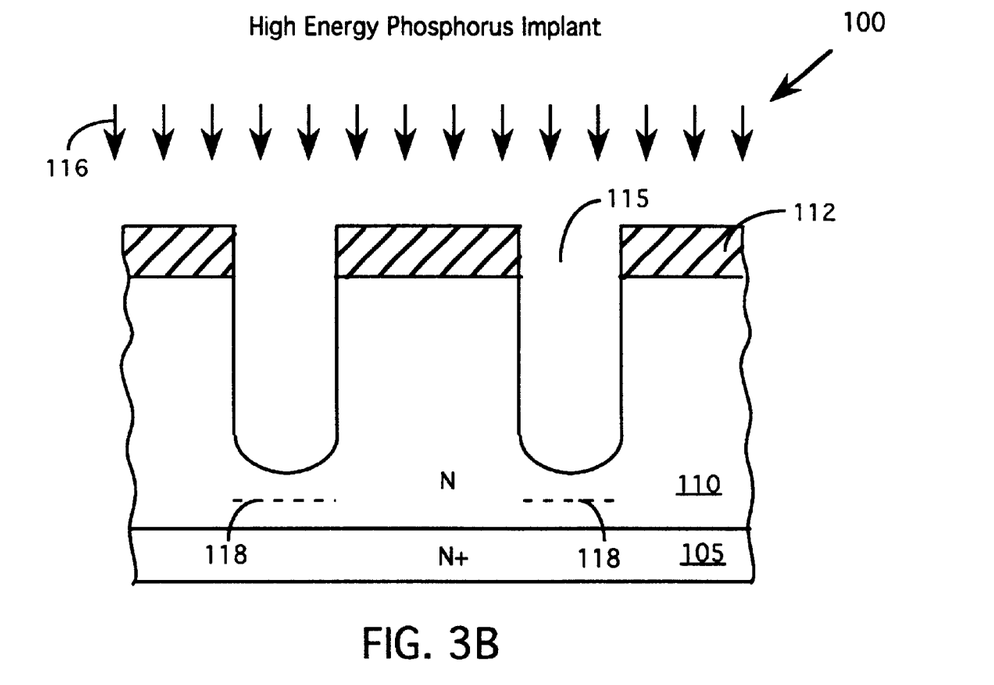

Referring to FIG. 3B, a photoresist 112 is employed as a trench mask to perform a trench etch process, which is a dry anisotropic etch process, to form trenches 115 of 0.2 to 2.0 microns in width and 0.5 to 2.0 micron in depth. With the trench mask 112 stays as a blocking mask, a high-energy implant with phosphorous ions 116 at 200–500 Kev with an ion beam of $1\times10^{12}$ to $1\times10^{15}/cm^2$ flux density is carried out. A high-dopant-concentration N+ buried region 118 is formed underneath the bottom of each trench 115. After the N+ buried region implant is completed, the photoresist 112 is removed.

Figure 3C:
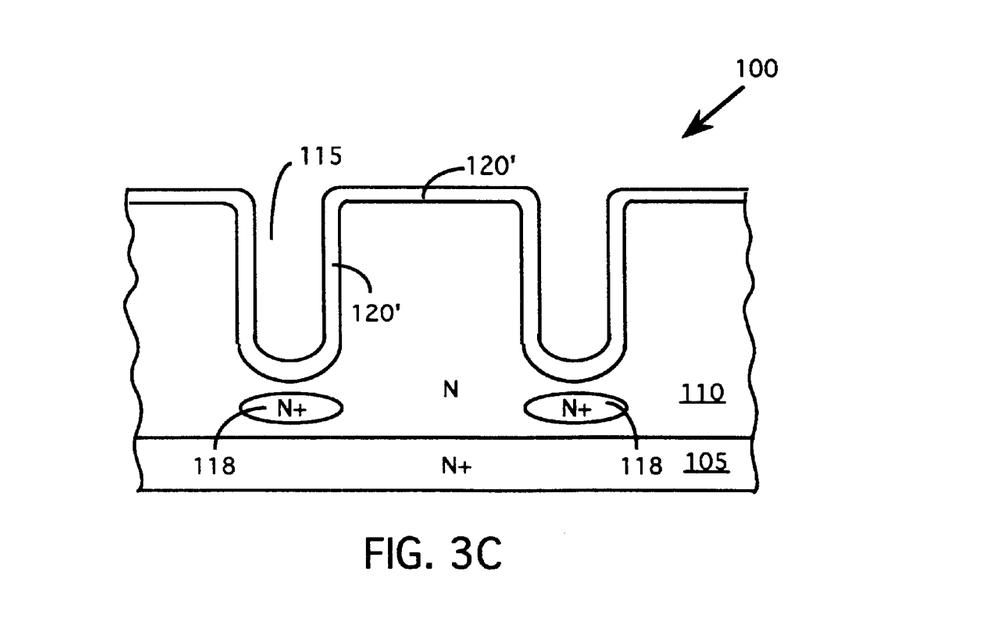

In FIG. 3C, a sacrification oxidation process is applied which can be either a dry or wet oxidation process conducted at a temperature of 900–1100° C. to form oxide layer of approximately 300–2000 Å in thickness which is followed by a scarification oxide etch process. A gate oxidation process is then carried out to form an insulation layer 120', which is preferably a thick-gate-oxide layer 120'. The gate oxidation process can be either a wet or a dry oxidation process carried out at a temperature of 800 to 1100° C. to form a thick-gate-oxide layer of thickness in the range between 400 Å to 4,000 Å. Meanwhile, the high-dopant-concentration N+ buried region 118 is diffused and driven to a lower region between the bottom of the trench 115 and the bottom N+ layer of the substrate 105.

Figure 3D:
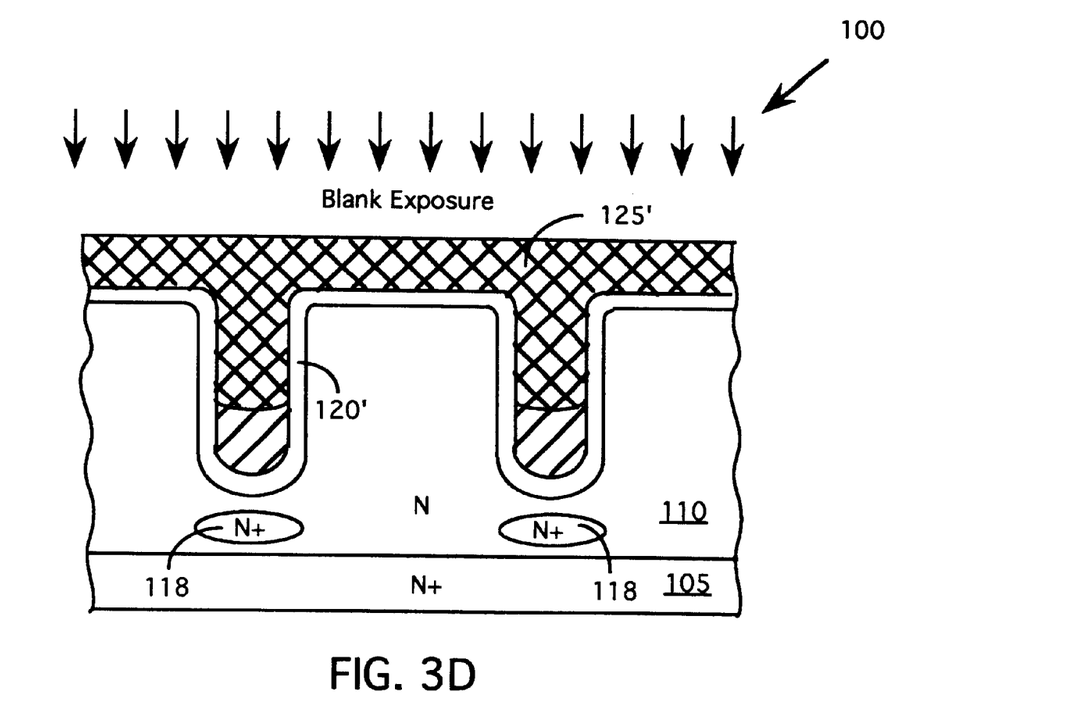
Figure 3E:
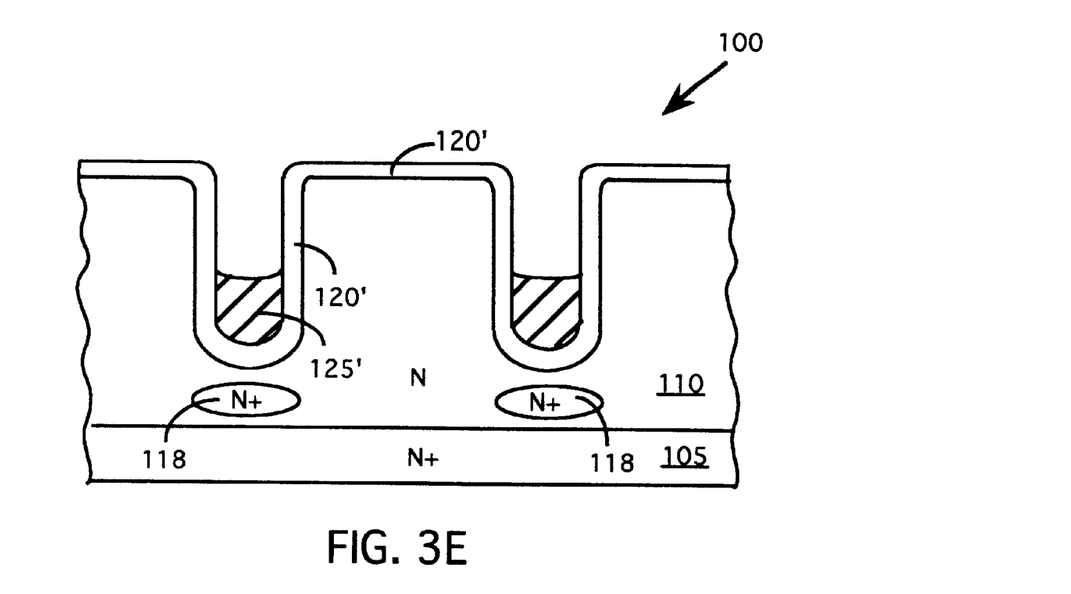
Figure 3F:
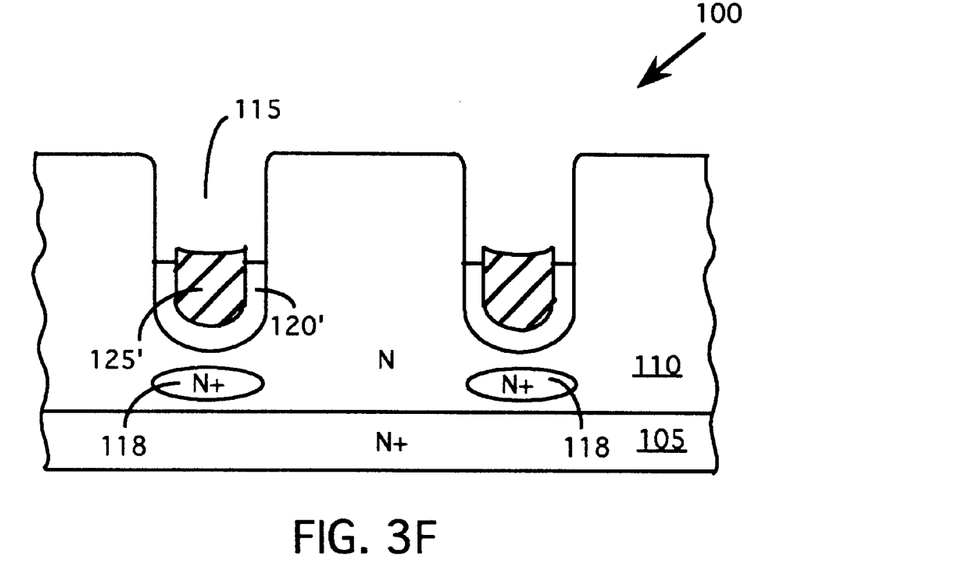

In FIG. 3D, a photoresist deposition process is performed to deposit a photoresist 125' filling the trenches and forming a layer above the top surface of the substrate ranging from 0.5 to 3.0 $\mu$m in thickness. A blank exposure under UV light is carried out to expose the portion of photoresist layer 125'. In FIG. 3D, a photoresist development process is performed to remove the portion of exposed photoresist layer from above the trenches and leaving only the photoresist 125' on the bottom portion of the trenches which is not exposed by controlling the UV light intensity and exposure time (FIG. 3E). In FIG. 3F, a wet oxide etch is performed to remove the thick-gate-oxide layer 120' from the top portion along the walls of the trenches 115. The thick-gate-oxide layer 120' at the bottom portions of the trenches 115 is protected by the resist layer 125' and are not removed.

Figure 3G:
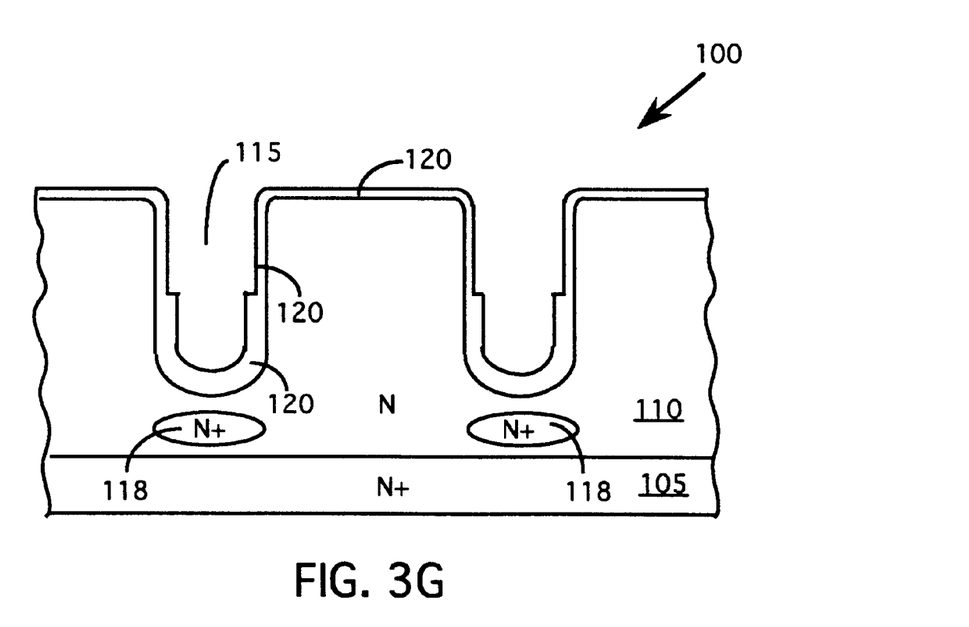
Figure 3H:
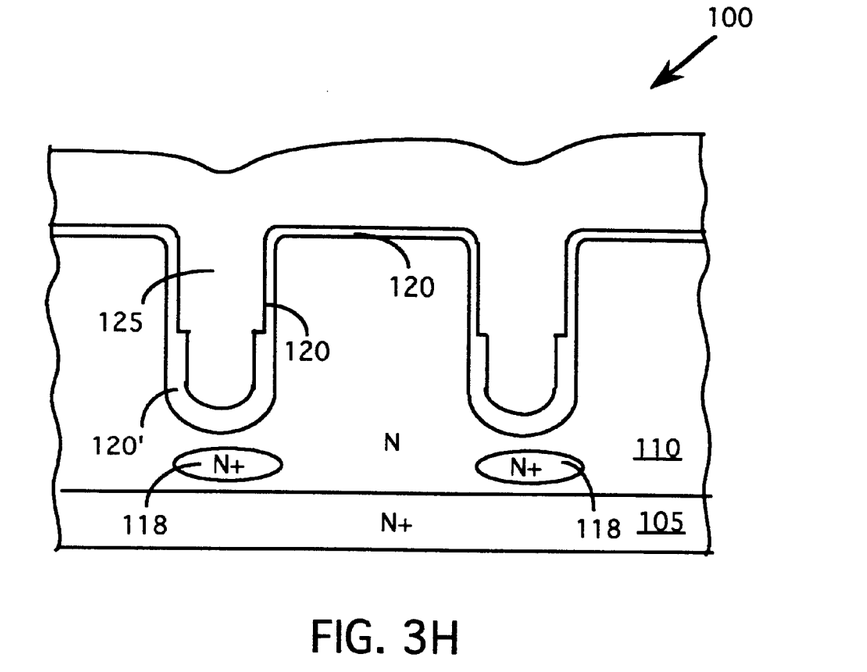
Figure 3I:
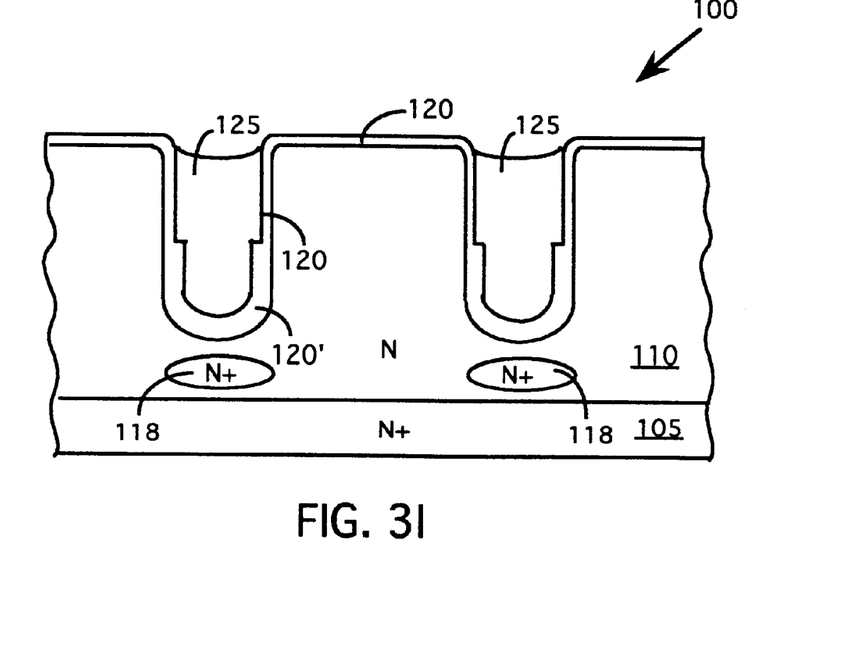
Figure 3J:
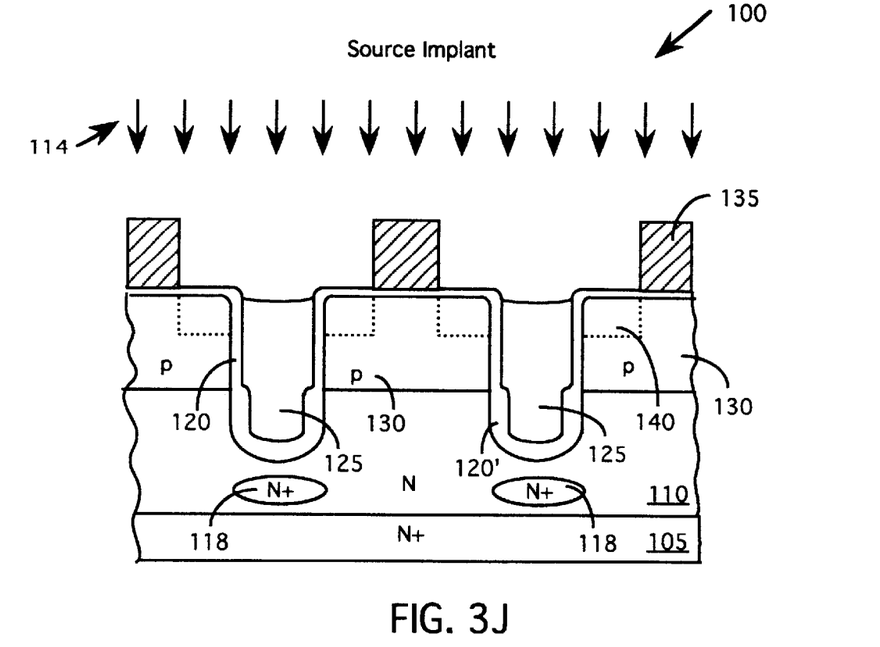
Figure 3K:
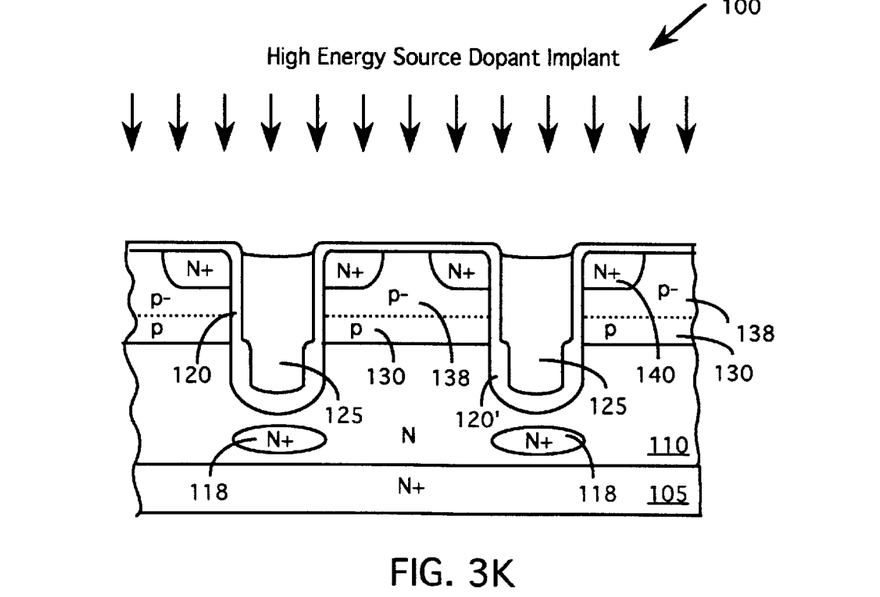

In FIG. 3G, the unexposed resist 125' at the bottom portion of the trenches 115 is stripped. A second oxidation process is performed to form a layer of thin-gate-oxide 120 covers the DMOS device with a layer thickness ranging from 150 to 1,000 Angstroms. In FIG. 3H, a gate polysilicon deposition process is performed to deposit a polysilicon layer 125 filling the trenches 115 and forming a layer above the top surface of the substrate ranging from 0.5 to 3.0 $\mu$m in thickness. In FIG. 3I, a dry etch process is performed to remove the polysilicon layer 125 from above the trenches 115. A POCL3 doping process is carried out at 950° C. to adjust the sheet resistance of the polysilicon layer 125 between 20 and 40 ohm/cm$^2$. In FIG. 3J, a blank p-boy implant is carried out with boron ions at 30–100 Kev with an ion beam of $2\times10^{13}$ to $2\times10^{14}/cm^2$ flux density to form the p-body region 130. A p-body diffusion process is then carried out at an elevated temperature of 1,000–1,200° C. for ten minutes to three hours to increase the depth of the p-body region 120 to 1.0–2.0 micrometers. A N+ block source mask 135 is applied to carry out an N+ implant to form the N+ region 140. The N+ implantation is carried out with an arsenic or phosphorus ion beam 114 at energy of 40–100 Kev and ion flux density of $5\times10^{15}$ to $1\times10^{16}/cm^2$. Referring to FIG. 3K, the resist, i.e., the N+ blocking mask 135, is stripped and the N+ source regions 140 are driven into desired junction depth ranging from 0.2 to 1.0 m by a diffusion process at a temperature of 900–1000° C. for 10 minutes to two hours.

In an alternate preferred embodiment (FIG. 4 below), a high-energy light dose blank source dopant, e.g., phosphorous, implant with ion beam of 250–400 Kev and ion flux of $10^{12}$ to $6\times10^{12}/cm^2$ is carried out. A shallow lightly doped p- regions 138 for reducing the threshold voltage for the DMOS cell is formed. As the gate are now padded with a thick-gate-oxide layer 120' at bottom with greater thickness than normal gate oxide layer, the threshold voltage, i.e., the Vth voltage, may be increased and the DMOS performance may be adversely affected. In order to compensate for this potential disadvantage, this shallow lightly doped body region is formed at a depth slightly greater than the source. According to FIG. 5, the peak body dopant concentration is reduced by this high-energy source dopant implant and a lower threshold voltage is thus achieved.

Figure 3L:
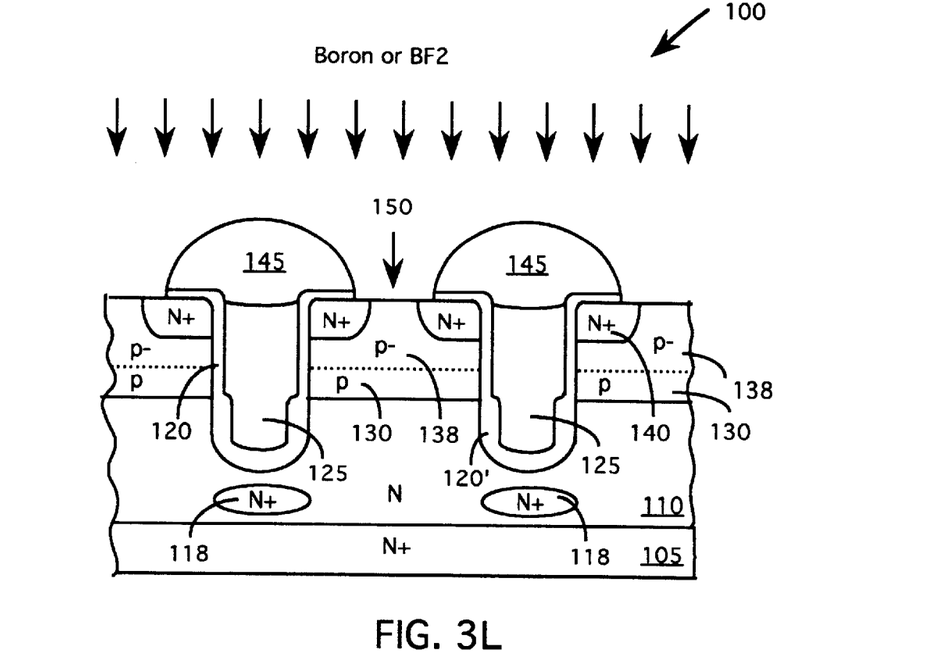
Figure 3M:
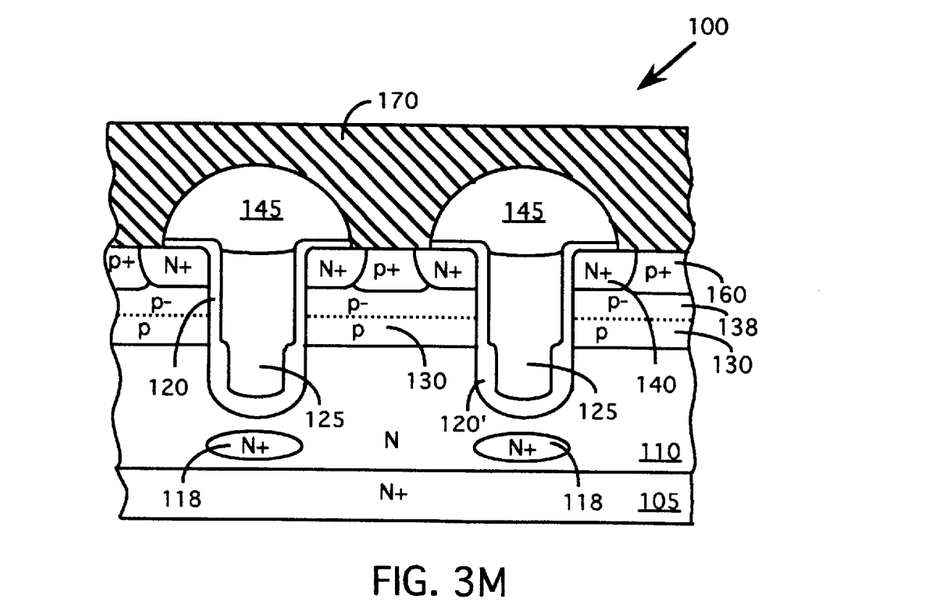

In FIG. 3L, an insulation layer 145, e.g., a BPSG or a PSG layer of approximately 5000–15,000 Å in thickness is deposited over the entire surface. A BPSG flow or BSG densification process is performed at 900–950° C. for thirty minutes to one hour. A contact mask is applied to etch a plurality of contact openings. 150. A body implant, e.g., boron or a BF$_2$ implant, is performed through the contact openings to form a plurality of high-concentration body-dopant region 160 to reduce the contact resistance. In FIG. 3M, a metal layer 170 is deposited over the insulation layer 145 to contact the source regions 140 via the contact openings 150. A metal mask is then applied to define a plurality of metal segments (not shown) to complete the manufacture process of the DMOS device 100.

Figure 4:
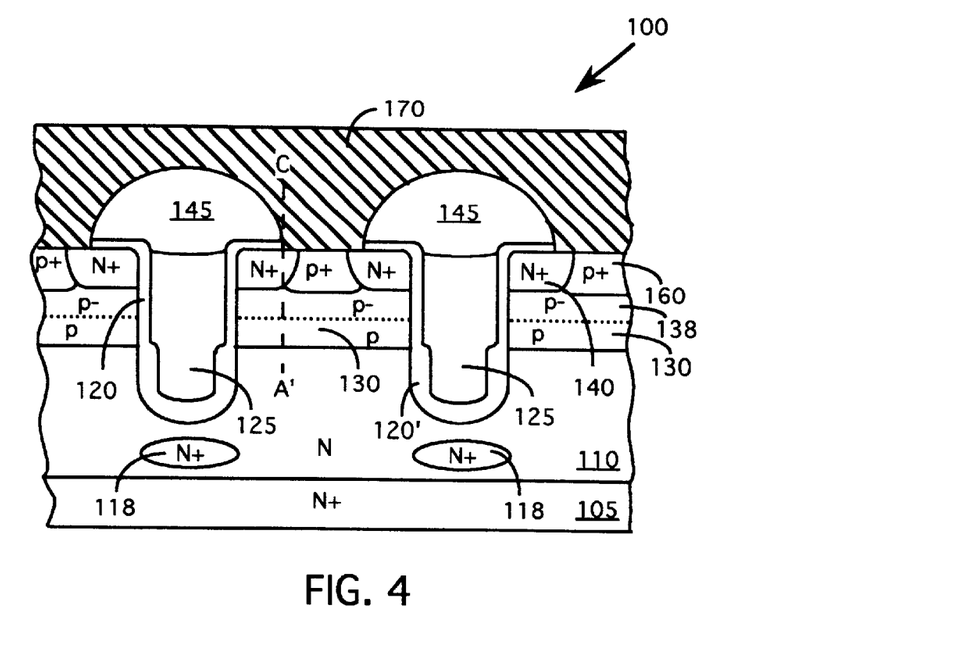
FIG. 4 is a cross-sectional view of a n-channel trench DMOS cell includes a champagne-glass shaped trenched gate padded by a double-gate-oxide structure with a high-dopant-concentration buried-region under the gate according to a DMOS configuration of this invention.

FIG. 4 is a cross sectional view of an alternate preferred embodiment. The thick-gate-oxide layer 120' with greater thickness may lead to an undesirable device characteristic that the threshold voltage required to turn on the device is increased due to the greater thickness of the breakdown prevention layer 120. In order to compensate for this disadvantage, a lightly doped body region 138 is formed to reduce threshold voltage. This lightly doped body region 138 is formed by a light dose, high-energy first-conductivity-type-dopant implant, e.g., a phosphorous implant, as will be further described below. This lightly doped body region 138 reduces the peak body dopant concentration and meanwhile the threshold voltage required to turn on the device as will be further discussed below.

Figure 5:
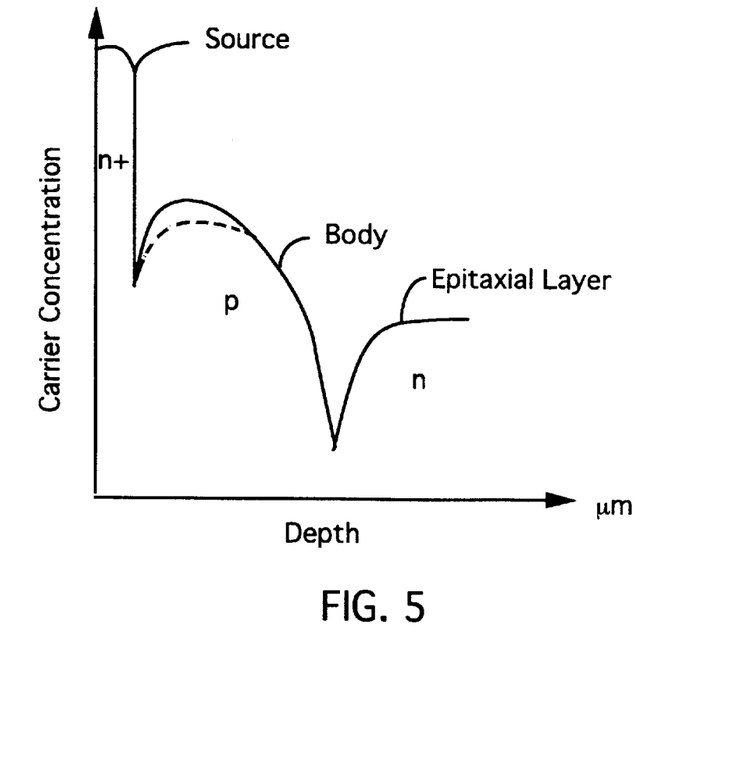
FIG. 5 is diagram for showing the variation of a net dopant concentration along a vertical line passing through a source region, a body region and an epitaxial layer.

Referring to FIG. 5 for a net dopant concentration along the line A–A'. The line A–A' passes through three different regions, i.e., the source regions 140, the body region 130, and the epitaxial layer 110. In each region, the net dopant concentration increases along the depth to reach a peak dopant concentration. The net dopant concentration then decreases gradually across the rest of the region in a downward direction along the line A–A'. As shown in FIG. 5, a comparison is made for the peak body dopant concentrations with and without the shallow lightly doped body region 138. A lower peak body-dopant concentration is formed in the body region 130 underneath the source region 140 when the shallow lightly doped body region 138 is implanted as that shown in FIG. 4. The threshold voltage is reduced with reduced peak body dopant concentration with the formation of the shallow lightly doped body-dopant region 138.

As shown in FIG. 4, the shallow lightly doped body region 138 is formed with a depth of approximately 0.2 to 0.6 micrometers. By adjusting the energy of the implanting source dopant ions, the depth of the shallow body-dopant region can be properly controlled. Since the body-dopant regions 138 is controlled to have a very shallow depth, the regions 138 serve a useful function of lowering the threshold voltage without an associated risk of inducing a punch through.

According to above descriptions, a DMOS transistor cell 100 formed in a semiconductor substrate 105 with a top surface and a bottom surface. The transistor cell includes a drain region, doped with impurities of a first conductivity type, formed in the semiconductor substrate 105 near the bottom surface. The transistor cell further includes a gate 125 disposed in a trench. The trenched gates 125 are padded with a double-gate-structure, which includes a thick-gate-oxide-layer 120', covering the trench walls near the bottom half of the trench with a bottom surface lying above the heavily doped substrate 105. The double gate-oxide structure further includes a thin-gate-oxide layer 120 cover the trench walls on the upper half of the trench. The trenches are opened from the top surface disposed substantially in a center portion of the transistor cell. A polysilicon layer disposed in the trench insulated from the substrate by the double-gate-oxide structure thus defining a champagne-glass shaped trench-gate 125. The transistor cell further includes a source region 140 disposed in the substrate surrounding an upper portion of the trench. The transistor cell further includes a body region 130 doped with impurities of a second conductivity type in the substrate surrounding the source region 140 and the trench gate 125 therein. The body region extends vertically downward to the thin/thick gate oxide boundary of the transistor cell wherein the body region 130 providing a channel for transmitting a current therein from the source region 140 to the drain 105 along a substantially vertical direction. The transistor cell further includes a high-dopant-concentration substrate-type buried region 118 disposed at a distance below the trenched gate 125 for decreasing the source-to-drain resistance $R_{ds}$ without significantly increasing a gate-to-drain capacitance $C_{GD}$.

In a preferred embodiment, the transistor cell further includes a shallow lightly doped body region 138 in an upper portion of the body region 130. The shallow lightly doped body region 138 has a depth slightly greater than the source region 140. The shallow lightly doped body region 138 is doped with a lower concentration of impurities of the second conductivity type than the body region 130 to reduce a threshold voltage. In a preferred embodiment, the shallow lightly doped body regions have a depth ranging from 0.2 to 0.6 micrometers. With the breakdown-prevention gate insulation layer 120 of greater thickness, an early breakdown is prevented without unduly increasing the threshold voltage.

According to FIGS. 3A to 3L, the present invention further discloses a method for fabricating a DMOS transistor on a substrate that has low gate/drain capacitance and low threshold voltage. The method includes the steps of: (a) forming an epitaxial layer 110 of a first conductivity type as a drain region on said substrate 105; (b) applying a trench mask for etching a plurality of trenches 115; (c) implanting a high-concentration buried substrate-type region 118 at a distance below each of the trenches then removing the trench mask; (d) growing a thick-gate-oxide layer followed by depositing photoresist; (e) exposing the photoresist for selectively developing and removing the photoresist from a top portion of the trench; (f) wet etch the thick gate oxide from the top portion along the trench wall; (g) removing the remaining photoresist and growing a thin-gate-oxide covering an upper portion of trench-walls thus forming a double-gate-oxide structure covering the walls of the trench; (h) depositing a polysilicon layer in the trench followed by removing the polysilicon from above the top surface of the trenches thus forming a champagne-glass shaped gate in the trench. In a preferred embodiment, the method further includes the steps of (i) performing a blank body implant with impurities of a second conductivity type followed by a body-diffusion process at an elevated temperature for forming a body layer 130; and (j) applying a source mask for performing a first-conductivity-type-dopant implant to form a plurality of source regions 140 of said first conductivity type. In another preferred embodiment, the method further includes steps of (k) performing a high energy light-dose first-conductivity-type-dopant implant to form a shallow lightly-doped body region 138 at an upper portion of the body regions 130 for reducing the device threshold voltage. In a preferred embodiment, the method for fabricating the DMOS transistor further includes a step (L) of forming a body contact resistance reduction region by performing a low-energy body-dopant implant to form a heavy body-doped region 160 between the source regions to reduce the contact resistance.

Therefore, the present invention provides a new DMOS fabrication process and a new device structure to enable those of ordinary skill in the art of trenched DMOS fabrication to reduce gate-to-drain capacitance to achieve higher device switching speed. Meanwhile, the technical difficulty of breakdown voltage degradation is resolved without causing higher threshold voltage due to a thicker gate-oxide. The performance characteristics of the trenched DMOS device are improved such that aforementioned limitations and difficulties as encountered in the prior art can be overcome. Specifically a novel trenched DMOS structure and fabrication process is provided to fabricate a double-gate-oxide structure under the gate to form champagne-glass shaped gates. The double gate-oxide structure includes a thick-gate-oxide covering the trench walls at the lower portion of the gates. The thick-oxide has a thickness about two-to-four time's thickness of the thin-gate-oxide layer covering the trench-walls on the upper portion of the trenched gates. An early breakdown is prevented while the gate/drain capacitance is reduced with improved switching speed. In another preferred embodiment, the trenched DMOS device is further provided with a shallow lightly doped body region to reduce the threshold voltage. The shallow lightly doped body region is further formed with less depth than the source regions. Therefore, shallow lightly doped body region is implemented to reduce the threshold voltage without causing a punch through problem by limiting the depth of the shallow lightly doped body region.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A DMOS power device supported on a substrate of a first conductivity type comprising:
   a drain of a first conductivity type disposed at a bottom surface of said substrate;
   a gate disposed in a trench opened from a top surface of said substrate, said gate having a polysilicon layer filling said trench padded by a gate-oxide layer;
   said gate-oxide layer includes a thick-oxide-layer covering walls of said trench at a lower portion of said trench and a thin-gate-oxide with a thickness thinner than said thick-oxide-layer covering walls of said trench above said lower portion of said trench; and
   a buried high-dopant-concentration region of said first conductivity-type disposed at a distance below and away from a bottom of said trench.

2. The DMOS power device of claim 1 further comprising: a source region of said first conductivity type disposed in said substrate surrounding a top portion of said trench; and
   a body region of a second conductivity type disposed in said substrate surrounding said trench and encompassing said source region.

3. The DMOS power device of claim 2 further comprising:
   at least a second transistor cell wherein said second transistor cell includes a second gate disposed in a second trench opened from a top surface of said substrate, said second gate having a polysilicon layer filling said second trench padded by a second gate-oxide layer;
   said second gate-oxide layer includes a second thick-oxide-layer covering walls of said second trench at a lower portion of said second trench and a second thin-gate-oxide with a thickness thinner than said second thick-oxide-layer covering walls of said second trench above said lower portion of said second trench;
   a second buried high-dopant-concentration region of said first conductivity-type disposed at a distance below and away from a bottom of said second trench;
   a second source region of said first conductivity type disposed in said substrate surrounding a top portion of said second trench; and
   a second body region of a second conductivity type disposed in said substrate surrounding said second trench and encompassing said second source region and said second body region extended to contact said body region of claim 2.

4. The DMOS power device of claim 2 further comprising:
   a shallow lightly-doped body-dopant region disposed in said body region surrounding said gate with a region depth greater than said source region.

5. The DMOS power device of claim 4 wherein:
   said shallow lightly-doped body region surrounding said gate having a depth ranging from 0.2 to 0.6 micrometers for reducing a device threshold voltage without inducing a punch-through.

6. The DMOS power device of claim 1 wherein:
   said thin-gate-oxide layer of said gate-oxide layer having a layer thickness ranging from one-fourth to one-half of a thickness of said thick-gate-oxide layer of said gate-oxide layer.

7. The DMOS power device of claim 1 wherein:
   said thick-gate-oxide layer of said gate-oxide layer having a layer thickness ranging from 450 to 4000 Angstroms and said thin-gate-oxide layer of said gate-oxide layer having a layer thickness about one-forth to one-half of said thick-gate-oxide layer ranging from 150 to 1000 Angstroms.

8. The DMOS power device of claim 1 wherein:
   said buried high-dopant-concentration region at a distance below and away from said bottom of said trench having a dopant concentration higher than said substrate and lower than said drain region.

9. A trenched power device supported on a substrate comprising:
   a gate disposed in a trench filled with a gate layer therein padded by a gate oxide layer comprising a gate oxide-layer of more than one thickness covering side and bottom walls of said trench; and
   a buried high-dopant-concentration region disposed at a distance below and away from a bottom of said trench having a same conductivity type as said substrate.

10. The trenched power of claim 9 wherein:
    said gate layer is a polysilicon layer.

11. The power device of claim 9 further comprising:
    a source region disposed in said substrate surrounding a top portion of said trench having a same conductivity type as said substrate; and
    a body region of a different conductivity type than said source region disposed in said substrate surrounding said trench and encompassing said source region.

12. The power device of claim 11 further comprising:
    a shallow lightly-doped body-dopant region disposed in said body region surrounding said gate with a region depth greater than said source region.

13. The power device of claim 11 wherein:
    said shallow lightly-doped body region surrounding said gate having a depth ranging from 0.2 to 0.6 micrometers for reducing a device threshold voltage without inducing a punch-through.

14. A trenched power device supported on a substrate comprising:
    a trenched gate disposed in a trench and a buried high-dopant-concentration region disposed at a distance below and away from a bottom of said trenched gate having a same conductivity type as said substrate.

* * * * *